United States Patent
Nakai et al.

(10) Patent No.: US 11,854,638 B2
(45) Date of Patent: Dec. 26, 2023

(54) NONVOLATILE SEMICONDUCTOR STORAGE DEVICE AND READ VOLTAGE CORRECTION METHOD

(71) Applicant: MegaChips Corporation, Osaka (JP)

(72) Inventors: Shunsuke Nakai, Osaka (JP); Atsufumi Kawamura, Osaka (JP); Yasuhisa Marumo, Osaka (JP); Handa Chen, Osaka (JP)

(73) Assignee: MEGACHIPS CORPORATION, Osaka (JP)

( * ) Notice: Subject to any disclaimer, the term of this patent is extended or adjusted under 35 U.S.C. 154(b) by 73 days.

(21) Appl. No.: 17/592,512

(22) Filed: Feb. 4, 2022

(65) Prior Publication Data
US 2022/0254426 A1  Aug. 11, 2022

(30) Foreign Application Priority Data

Feb. 8, 2021 (JP) ................. 2021-018273

(51) Int. Cl.
*G11C 29/12* (2006.01)
*G11C 29/44* (2006.01)
*G11C 29/42* (2006.01)

(52) U.S. Cl.
CPC .... *G11C 29/12005* (2013.01); *G11C 29/1201* (2013.01); *G11C 29/42* (2013.01); *G11C 29/4401* (2013.01)

(58) Field of Classification Search
CPC .......... G11C 29/12005; G11C 29/1201; G11C 29/42; G11C 29/4401; G11C 29/021; G11C 29/028
See application file for complete search history.

(56) References Cited

U.S. PATENT DOCUMENTS

2014/0204671 A1* 7/2014 Sharon ............... G11C 11/5642
 365/185.09
2016/0034349 A1* 2/2016 Choi ..................... G11C 29/26
 714/764
2021/0090680 A1* 3/2021 Bangalore Lakshman ..................
 G11C 11/2273

FOREIGN PATENT DOCUMENTS

JP  2015-520907 A  7/2015
WO  2013/166200 A1  11/2013

* cited by examiner

*Primary Examiner* — Mohammed A Bashar
(74) *Attorney, Agent, or Firm* — XSENSUS LLP

(57) ABSTRACT

A memory stores dummy data including a first data area having more "0" than "1" of a binary logic and a second data area having more "1" than "0" of the binary logic. An ECC processor detects a first error bit number related to the first data area and a second error bit number related to the second data area. A calculator calculates a relative difference of the first error bit number from the second error bit number. A comparator compares the relative difference with a predetermined value. A corrector corrects a read voltage on the basis of a result of comparison by the comparator.

16 Claims, 11 Drawing Sheets

NONVOLATILE SEMICONDUCTOR STORAGE DEVICE AND READ VOLTAGE CORRECTION METHOD

CROSS REFERENCE TO RELATED APPLICATION

The present application is based on, and claims priority from Japanese Patent Application Serial Number 2021-018273 filed Feb. 8, 2021, the disclosure of which is hereby incorporated by reference herein in its entirety.

BACKGROUND

Technical Field

The present invention relates to a nonvolatile semiconductor storage device such as a flash memory and a read voltage correction method.

Related Art

In a nonvolatile semiconductor storage device such as a NAND flash memory, "0" or "1" of a binary logic is stored in accordance with a state in which charges are accumulated in a cell of a memory cell transistor (a state in which a threshold voltage is low) and a state in which charges are not accumulated in the cell (a state in which a threshold voltage is high). In data read processing, when a read voltage is applied to a control gate of the memory cell transistor, "0" is read due to no current flowing between a source and a drain, and "1" is read due to a current flowing between the source and the drain. Since a threshold voltage distribution of a plurality of memory cell transistors constituting a memory cell array fluctuates due to data retention (a phenomenon in which charges accumulated in a cell unintentionally leak) or read disturb (a phenomenon in which charges are unintentionally injected into a cell), it is necessary to perform processing of correcting the read voltage in accordance with a state of the fluctuation.

A method of controlling a nonvolatile memory disclosed in JP 2015-520907 A includes scrambling data to equalize a ratio between "0" and "1" of the binary logic, writing the scrambled data in a predetermined part of the nonvolatile memory, reading the data from the predetermined part of the nonvolatile memory, counting a "0" bit number and a "1" bit number of the read data and calculating a difference between the bit numbers when the read data is uncorrectable by ECC processing, and correcting a read voltage for reading the data from the nonvolatile memory on the basis of the difference.

In the method disclosed in JP 2015-520907 A, when the data read from the nonvolatile memory is uncorrectable by the ECC processing (that is, when ECC decoding fails), correction processing of the read voltage is started to be executed. Further, the correction processing needs processing of counting the "0" bit number and the "1" bit number of the read data. Therefore, in reading data from the nonvolatile memory, a latency in a case where the ECC decoding fails is large.

SUMMARY

The present disclosure is directed to obtaining a nonvolatile semiconductor storage device and a read voltage correction method capable of reducing latency associated with correction processing of read voltage.

A nonvolatile semiconductor storage device according to one aspect of the present disclosure has circuitry including a storage configured to store data, and a control circuit configured to control the storage, in which the storage is configured to store known data including a first data area having more "0" than "1" of a binary logic and a second data area having more "1" than "0" of the binary logic, and the circuitry is configured to read the known data from the storage and detect a first error bit number as a number of error bits occurring in the first data area and a second error bit number as a number of error bits occurring in the second data area, calculate a relative difference of the first error bit number from the second error bit number, compare the relative difference with a first value, and correct a read voltage for reading data from the storage, based on a result of comparison.

DETAILED DESCRIPTION

Figure 1:
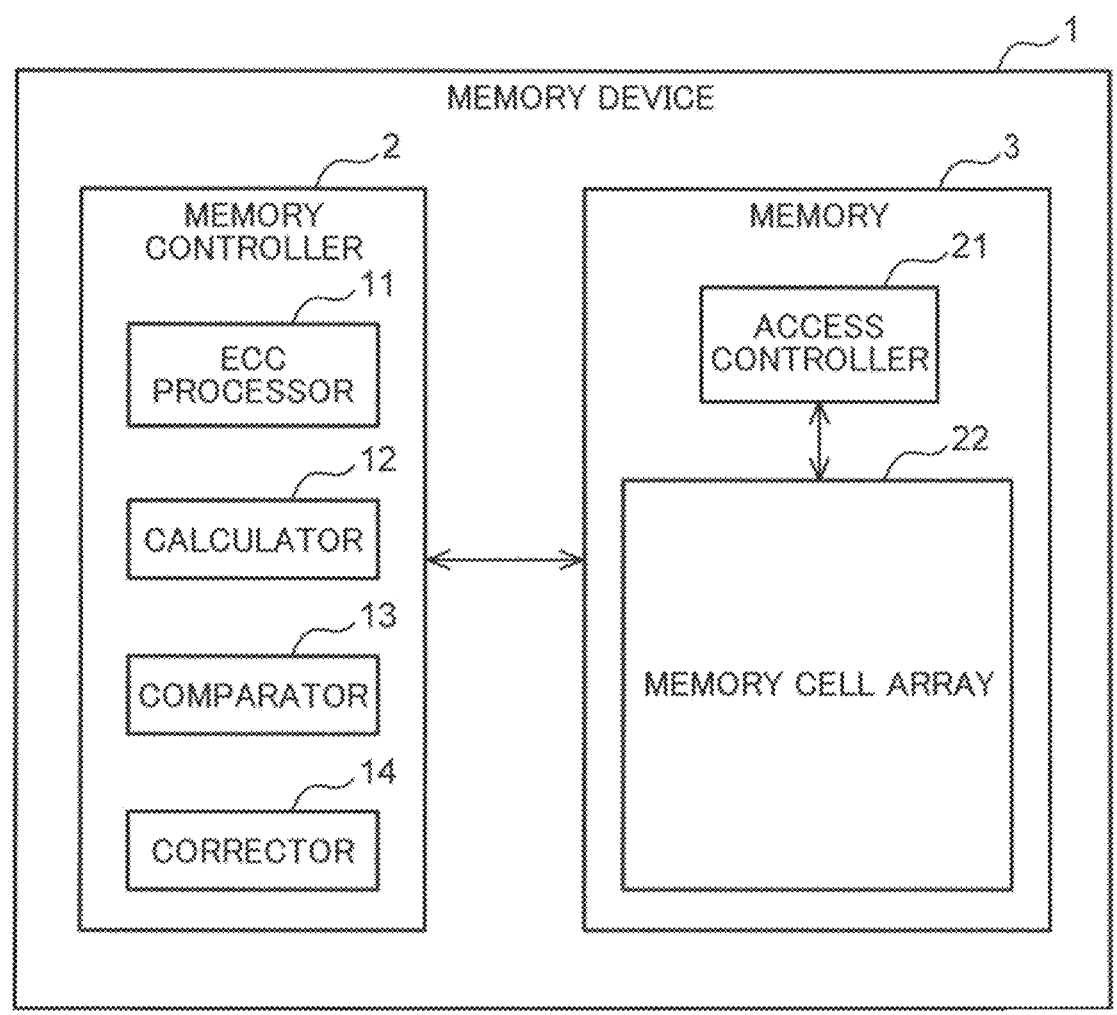
FIG. 1 is a diagram illustrating a simplified configuration of a memory device according to a first embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

Hereinafter, embodiments of the present invention will be described in detail with reference to the drawings. The elements with the same reference numerals in different drawings indicate the same or corresponding elements.

First Embodiment

In this embodiment, a memory device 1 including a single level cell (SLC) memory will be described.

FIG. 1 is a diagram illustrating a simplified configuration of a memory device 1 according to the present embodiment. The memory device 1 is a nonvolatile semiconductor storage device including, for example, a NAND flash memory.

The memory device 1 includes a memory controller 2 (control unit) and a memory 3 (storage unit). The memory controller 2 controls operation of the memory 3. The memory 3 includes an access controller 21 and a memory cell array 22. The memory cell array 22 includes a plurality of memory cell transistors arranged in a matrix. The access controller 21 controls access (reading, writing, erasing, refreshing, and the like of data) to the memory cell array 22 by the memory controller 2.

The memory controller 2 includes an error check and correct (ECC) processor 11 (detector), a calculator 12, a comparator 13, and a corrector 14. Processing contents executed by these processors will be described later. Each of these processors may be configured as a function implemented by a data processing device such as a CPU executing a predetermined program, or may be configured as hardware. Note that these processors may be provided not in the memory controller 2 but in the access controller 21.

Figure 2:
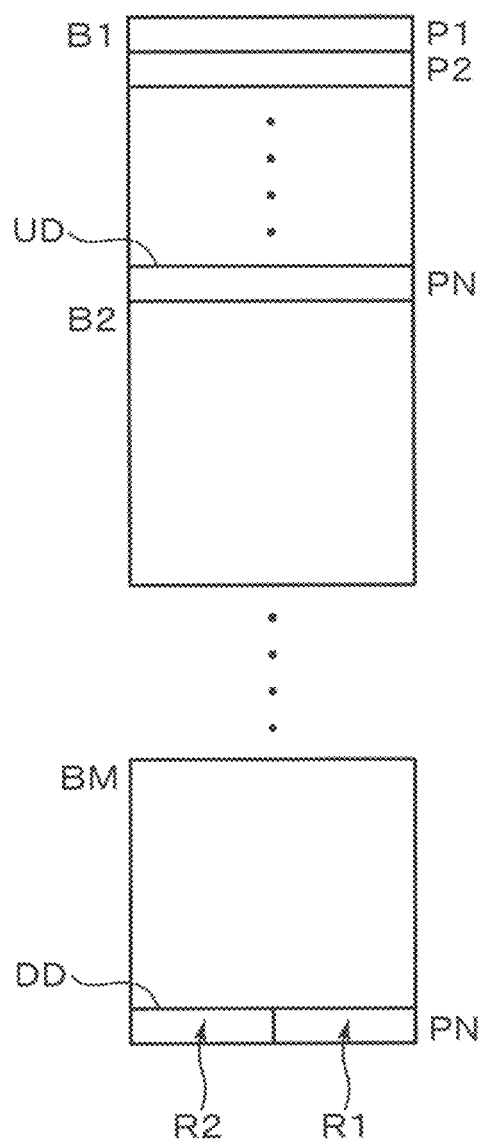
FIG. 2 is a diagram illustrating a part of a storage area of a memory cell array.

FIG. 2 is a diagram illustrating a part of a storage area of the memory cell array 22. The memory cell array 22 includes a plurality of blocks B (B1, B2, . . . , BM) each of which is a data erase unit. Each block B has a plurality of pages P (P1, P2, . . . , PN) each of which is a data reading unit and data writing unit.

In an example illustrated in FIG. 2, the page PN of the block B1 stores user data UD. The page PN of the block BM stores dummy data DD which is known data. The dummy data DD includes a first data area R1 and a second data area R2.

Figure 3:
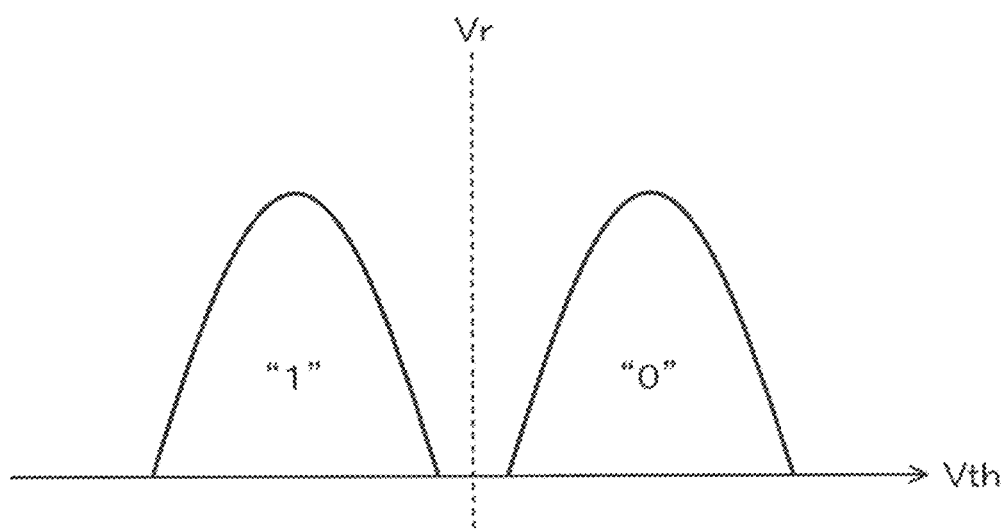
FIG. 3 is a graph illustrating a threshold voltage distribution of a plurality of memory cell transistors for a page storing user data.

FIG. 3 is a graph illustrating a threshold voltage distribution of the plurality of memory cell transistors for the page P storing the user data UD. In the processing of writing the user data UD to the memory 3, after ECC encoding is performed by the ECC processor 11, the memory controller 2 performs randomization processing of data such that a "0" bit number and a "1" bit number of a binary logic are equal. Thus, a total number of memory cell transistors storing "0" and a total number of memory cell transistors storing "1" are equal to each other. Ideally, a minimum value of a threshold voltage Vth of the memory cell transistors storing "0" (a left end of a distribution of "0" in FIG. 3) is higher than a maximum value of the threshold voltage Vth of the memory cell transistors storing "1" (a right end of the distribution of "1" in FIG. 3). Then, a read voltage Vr is set as an intermediate voltage between the minimum value and the maximum value. In the data read processing, the access controller 21 applies the read voltage Vr to a control gate of the memory cell transistors, reads "0" due to no current flowing between a source and a drain, and reads "1" due to a current flowing between the source and the drain.

Figure 4:
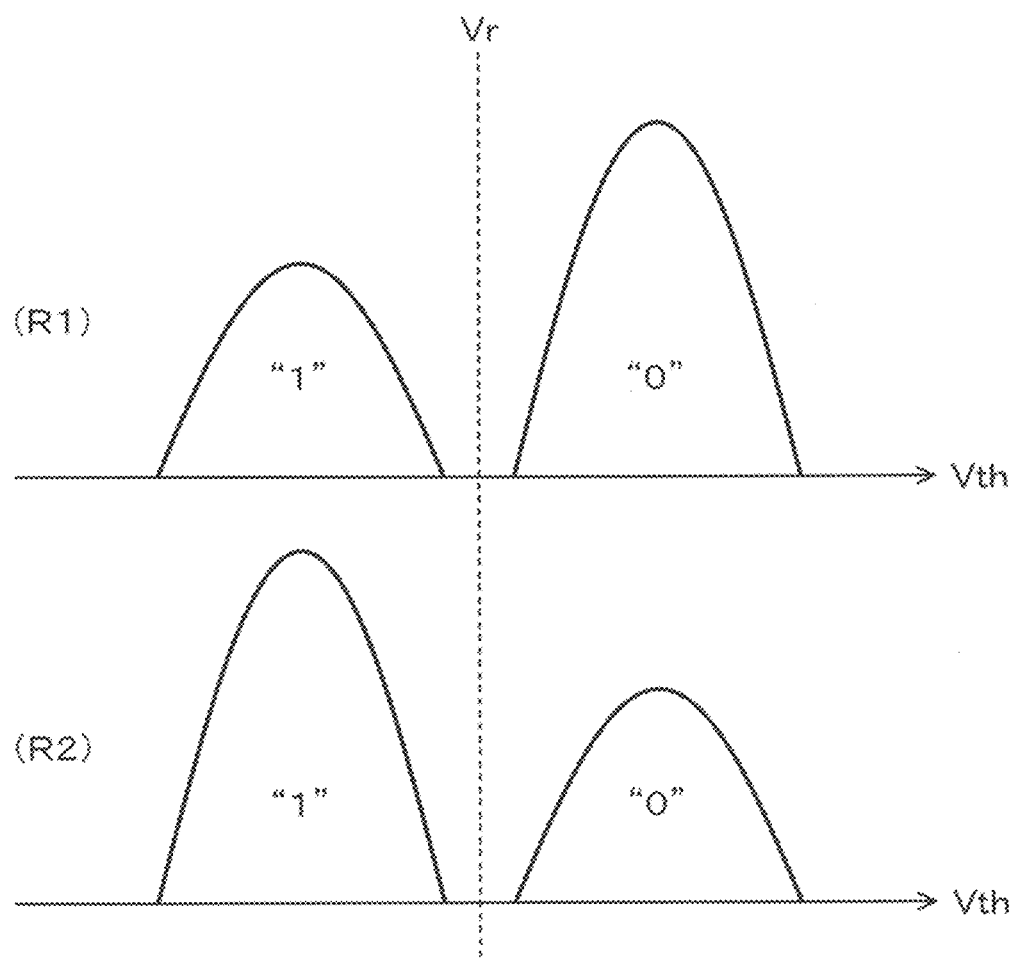
FIG. 4 shows graphs illustrating a threshold voltage distribution of the plurality of memory cell transistors for a page storing dummy data.

FIG. 4 shows graphs illustrating a threshold voltage distribution of the plurality of memory cell transistors for each of the first data area R1 and the second data area R2 for the page P storing the dummy data DD. The first data area R1 stores data having a larger "0" bit number than the "1" bit number. For example, a proportion of the "1" bit number is 40%, and a proportion of the "0" bit number is 60%. The second data area R2 stores data having a larger "1" bit number than the "0" bit number. For example, the proportion of the "0" bit number is 40%, and the proportion of the "1" bit number is 60%.

In the processing of writing the dummy data DD to the memory 3, after the ECC encoding is performed by the ECC processor 11, the memory controller 2 does not perform the randomization processing of the data. Thus, in the first data area R1, the total number of memory cell transistors storing "0" is larger than the total number of memory cell transistors storing "1". In the second data area R2, the total number of memory cell transistors storing "1" is larger than the total number of memory cell transistors storing "0". However, when the entire page including the first data area R1 and the second data area R2 is viewed, the "0" bit number and the "1" bit number are equal to each other. Therefore, writing of the dummy data DD to the memory cell array 22 is allowed.

Ideally, in each of the first data area R1 and the second data area R2, the minimum value of the threshold voltage Vth of the memory cell transistors storing "0" (the left end of a distribution of "0" in FIG. 4) is higher than the maximum value of the threshold voltage Vth of the memory cell transistors storing "1" (the right end of the distribution of "1" in FIG. 4). Then, a read voltage Vr is set as an intermediate voltage between the minimum value and the maximum value.

Figure 5:
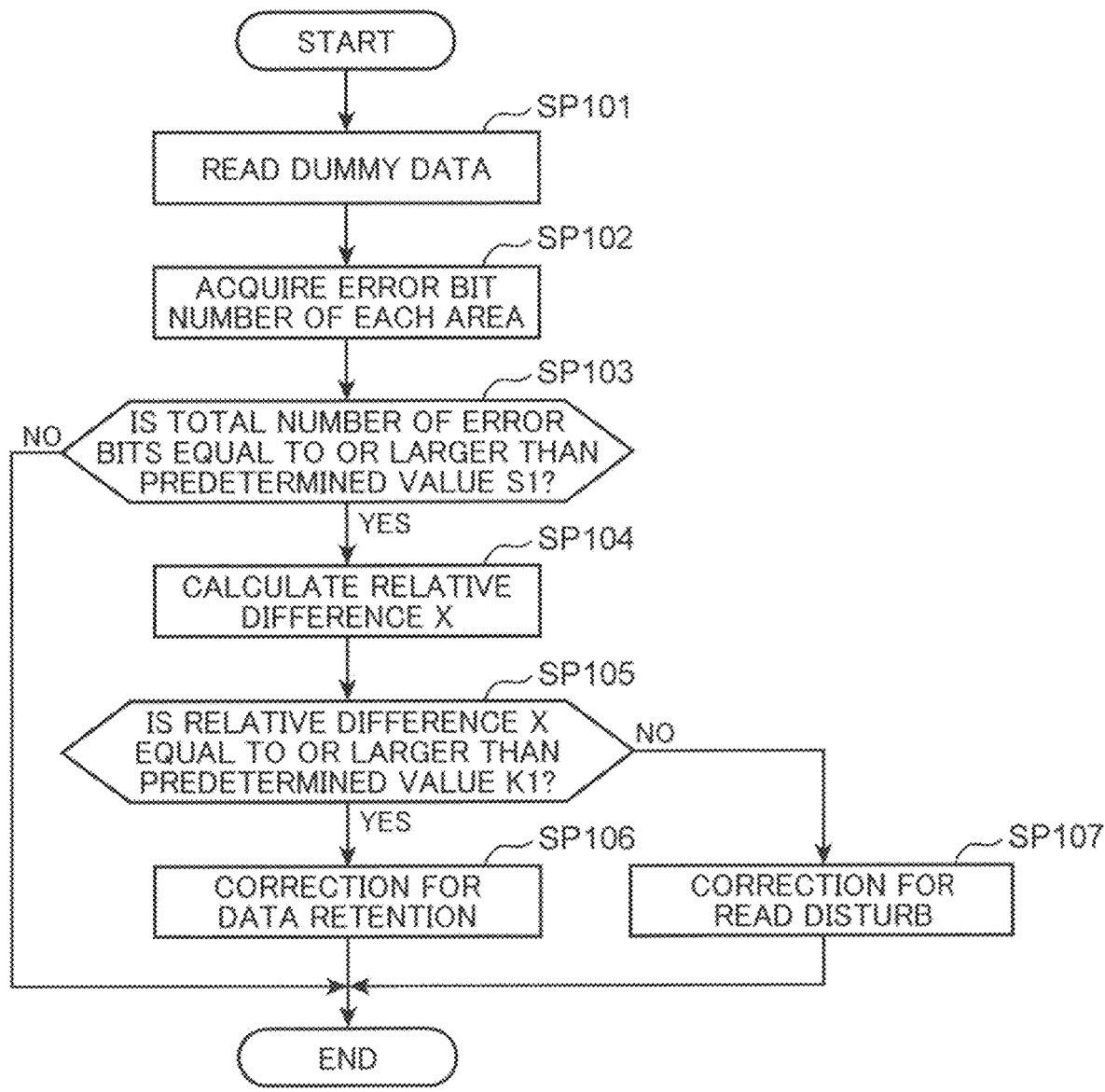
FIG. 5 is a flowchart illustrating contents of correction processing of a read voltage executed by a memory controller.

FIG. 5 is a flowchart illustrating the contents of correction processing of the read voltage executed by the memory controller 2. Each time power supply from an external power supply to the memory device 1 is started and the memory device 1 is activated, the memory controller 2 executes the correction processing of the read voltage as a part of activation processing. When a predetermined time has elapsed since previous execution of the correction processing of the read voltage, the memory controller 2 executes the correction processing of the read voltage by using an idle time in which access from the memory controller 2 to the memory 3 is not occurring. Further, the memory controller 2 executes the correction processing of the read voltage when a total number of error bits occurring in the user data UD read from the memory cell array 22 in a normal operation of the memory 3 exceeds a correctable value (upper limit value of correction capability) by the ECC processor 11. Note that the memory controller 2 may execute the correction processing of the read voltage at all these timings, or may execute the correction processing of the read voltage at any one or more timings.

First, in step SP101, the memory controller 2 reads the dummy data DD from the memory cell array 22 using the current read voltage Vr (the corrected read voltage Vr when the read voltage Vr has been corrected before). However, the dummy data DD may be read using an initial value of the read voltage Vr (the read voltage Vr before correction when the read voltage Vr has been corrected before) instead of the current read voltage Vr.

Next, in step SP102, the ECC processor 11 detects a first error bit number V1 as the number of error bits occurring in the first data area R1 of the read dummy data DD and a second error bit number V2 as the number of error bits occurring in the second data area R2. The calculator 12 acquires the first error bit number V1 and the second error bit number V2 from the ECC processor 11.

Figure 6:
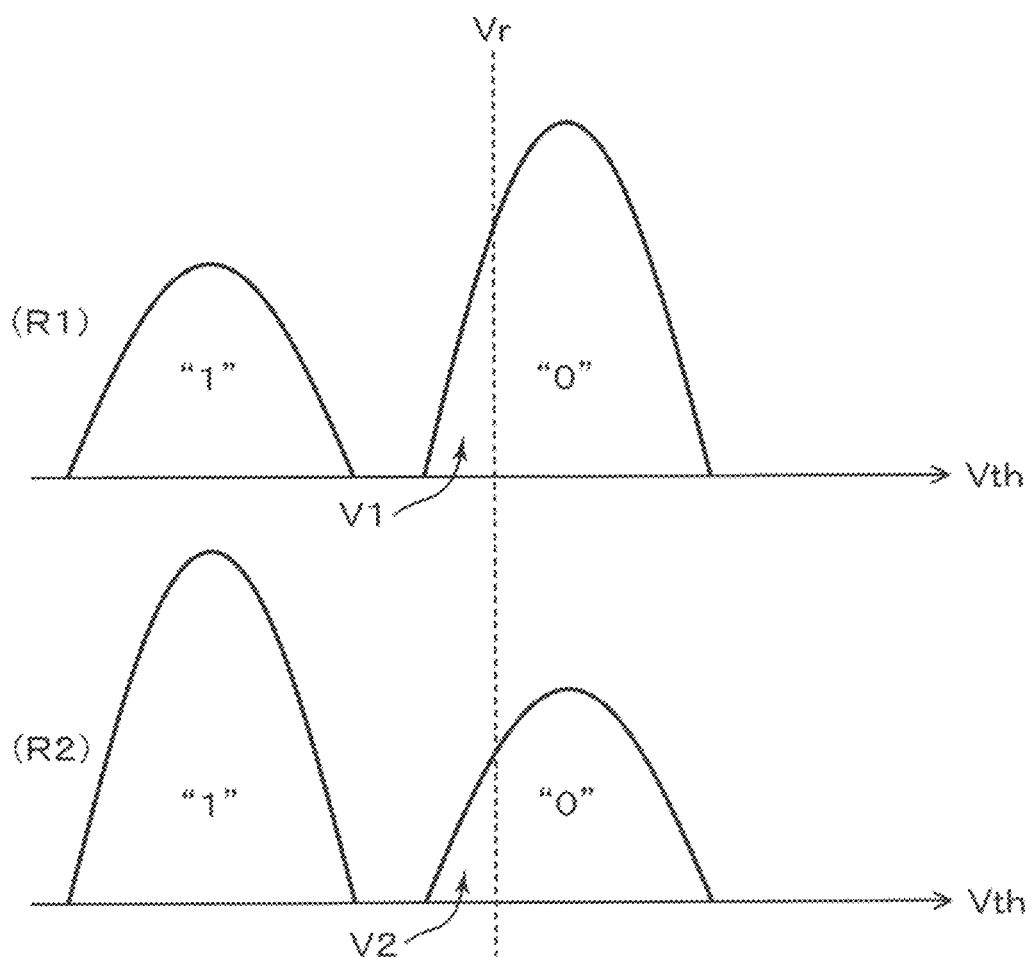
FIG. 6 shows graphs illustrating a threshold voltage distribution in a situation where data retention occurs.

FIG. 6 shows graphs illustrating a threshold voltage distribution in a situation where data retention occurs. Since data retention is a phenomenon in which charges (electrons) accumulated in a cell unintentionally leak, the threshold voltage distribution is shifted in a low voltage direction (left in FIG. 6) as a whole due to occurrence of the data retention. Thus, in a distribution of "0" in the first data area R1, the number of memory cell transistors in which the threshold voltage Vth has decreased to less than the current read voltage Vr is the first error bit number V1. In a distribution of "0" in the second data area R2, the number of memory cell transistors in which the threshold voltage Vth has decreased to less than the current read voltage Vr is the second error bit number V2. As illustrated in FIG. 6, when the data retention occurs, the first error bit number V1 is larger than the second error bit number V2.

Figure 7:
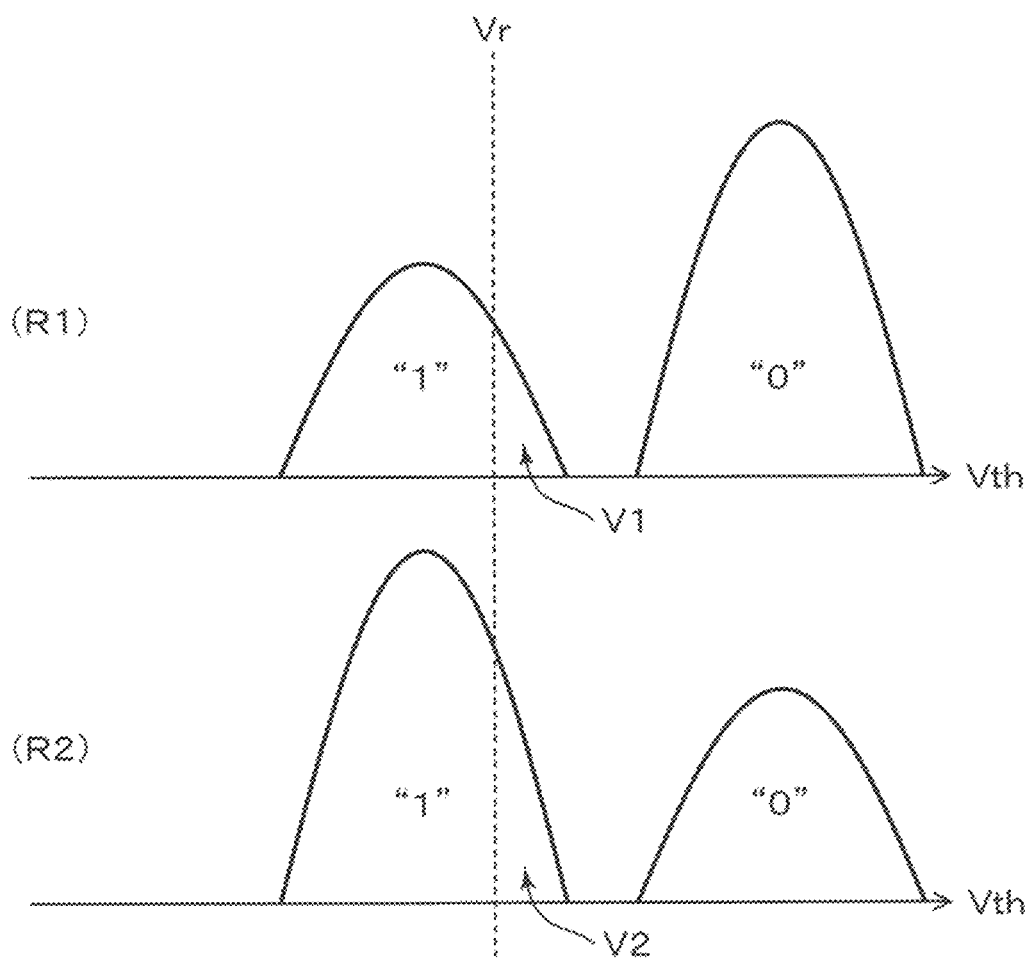
FIG. 7 shows graphs illustrating a threshold voltage distribution in a situation where read disturb occurs.

FIG. 7 shows graphs illustrating a threshold voltage distribution in a situation where read disturb occurs. Since the read disturb is a phenomenon in which charges (electrons) are unintentionally injected into the cell, the threshold voltage distribution is shifted in a high voltage direction (right in FIG. 7) as a whole due to occurrence of the read disturb. Thus, in a distribution of "1" in the first data area R1, the number of memory cell transistors in which the threshold voltage Vth increases to exceed the current read voltage Vr is the first error bit number V1. In a distribution of "1" in the second data area R2, the number of memory cell transistors in which the threshold voltage Vth increases to exceed the current read voltage Vr is the second error bit number V2. As illustrated in FIG. 7, when read disturb occurs, the second error bit number V2 is larger than the first error bit number V1.

Next, in step SP103, the memory controller 2 determines whether a total number of error bits occurring in the dummy data DD (V1+V2) is equal to or larger than a predetermined value S1 set in advance. The predetermined value S1 may be set to a value lower than the upper limit value of the error correction capability by the ECC processor 11.

When the total number of error bits (V1+V2) is less than the predetermined value S1 (step SP103: NO), the correction processing of the read voltage Vr is unnecessary, and thus the memory controller 2 ends the processing.

When the total number of error bits (V1+V2) is equal to or larger than the predetermined value S1 (step SP103: YES), next, in step SP104, the calculator 12 calculates a relative difference X of the first error bit number V1 from the second error bit number V2 by performing calculation of the following equation (1).

$$X=(V1-V2)/V2 \qquad (1)$$

Next, in step SP105, the comparator 13 compares the relative difference X with a predetermined value K1 (first value) set in advance. The predetermined value K1 is, for example, "0".

When the relative difference X is equal to or larger than the predetermined value K1 (step SP105: YES), next, in step SP106, the corrector 14 executes correction processing for data retention. Specifically, the corrector 14 corrects the read voltage Vr to be lower than a current value. As described above, the read voltage Vr after the current correction is used as the read voltage Vr when the dummy data DD is read next time. As a result, the read voltage Vr can be updated to an appropriate value every time the correction processing is executed by the corrector 14.

When the relative difference X is less than the predetermined value K1 (step SP105: NO), next, in step SP107, the corrector 14 executes correction processing for read disturb. Specifically, the corrector 14 corrects the read voltage Vr to be higher than the current value. Similarly to the above, the read voltage Vr after the current correction is used as the read voltage Vr when the dummy data DD is read next time.

A correction amount (shift amount) of the read voltage Vr may be a fixed value set in advance, or may be a variation value that varies in accordance with a value of at least one parameter. It is possible to use, as the parameters, for example, the total number of error bits (V1+V2), a value of the relative difference X, the number of accesses to the memory 3 since the correction processing of the read voltage is previously executed, a total number of erasure executions so far, a total number of writing executions so far, and elapsed time since the dummy data DD is written in the memory 3. The corrector 14 holds table information in which a relationship between a plurality of values of each parameter and an optimum correction amount is defined in a nonvolatile internal memory (or an external memory), and sets the correction amount of the read voltage Vr by referring to the table information. In the table information, for example, as each value of the total number of error bits (V1+V2), the relative difference X, the number of accesses, and the elapsed time is larger, a larger correction amount is set.

In the memory device 1 according to the present embodiment, the memory 3 stores the dummy data DD including the first data area R1 having more "0" than "1" of the binary logic and the second data area R2 having more "1" than "0" of the binary logic. Then, the memory controller 2 reads the dummy data DD from the memory 3, and corrects the read voltage Vr in accordance with a state of occurrence of the error bits in the first data area R1 and the second data area R2 at that time. Therefore, since the read voltage Vr can be corrected by simple processing of reading the dummy data DD from the memory 3, the latency associated with the correction processing of the read voltage Vr can be reduced.

Further, in the memory device 1 according to the embodiment, it is possible to easily execute the correction processing of the read voltage Vr for the memory 3 including the SLC memory.

In the memory device 1 according to the embodiment, it is possible to appropriately set not only a correction direction of the read voltage Vr but also the correction amount of the read voltage Vr.

In the memory device 1 according to the embodiment it is possible to execute the correction processing of the read voltage Vr at an appropriate timing before a situation in which error bits frequently occur.

Second Embodiment

In this embodiment, a memory device 1 including a triple level cell (TLC) memory will be described focusing on differences from the first embodiment.

Figure 8:
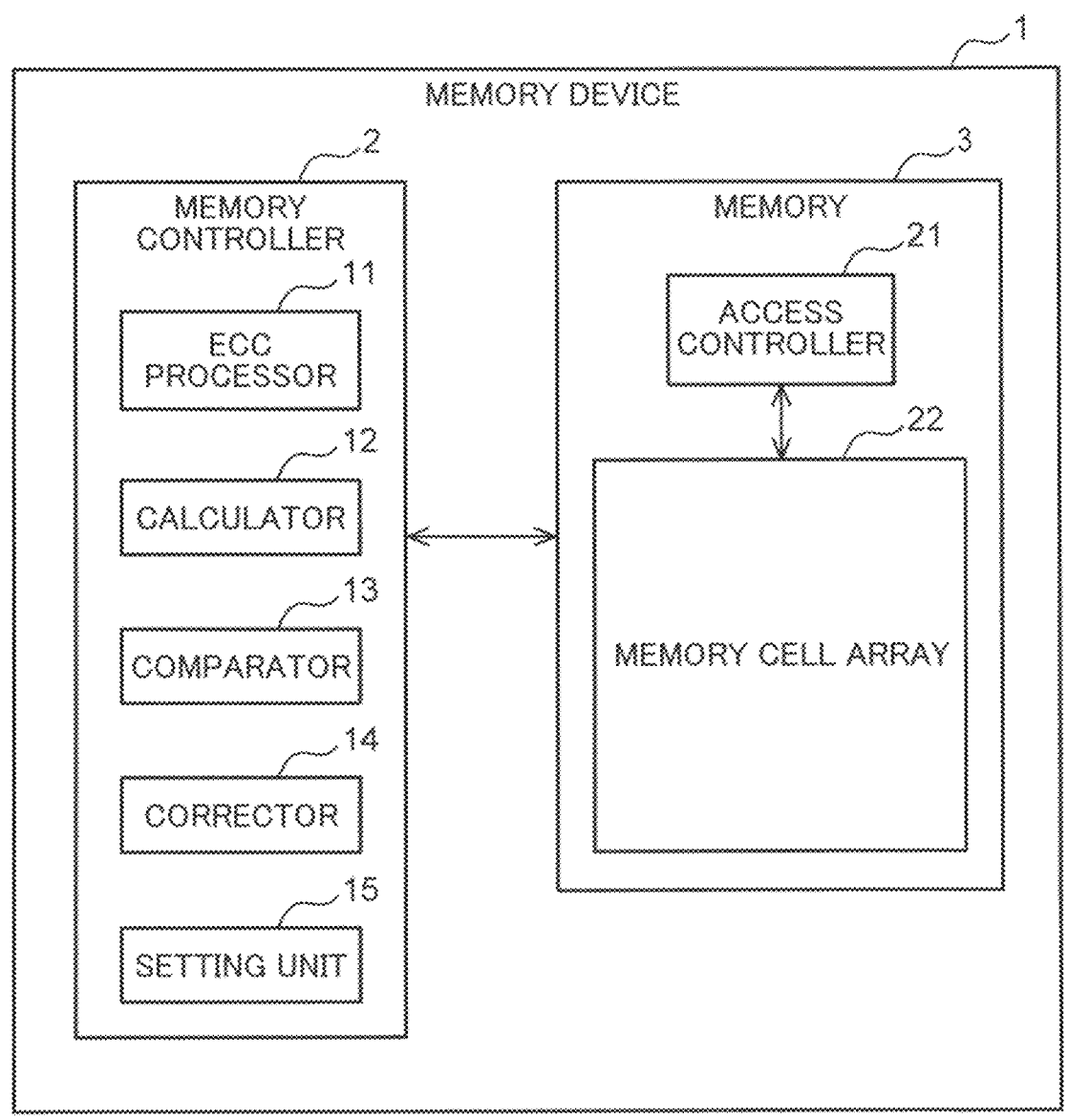
FIG. 8 is a diagram illustrating a simplified configuration of a memory device according to a second embodiment.

FIG. 8 is a diagram illustrating a simplified configuration of the memory device 1 according to the embodiment. On the basis of the configuration illustrated in FIG. 1, the memory controller 2 further includes a setting unit 15.

Figure 9:
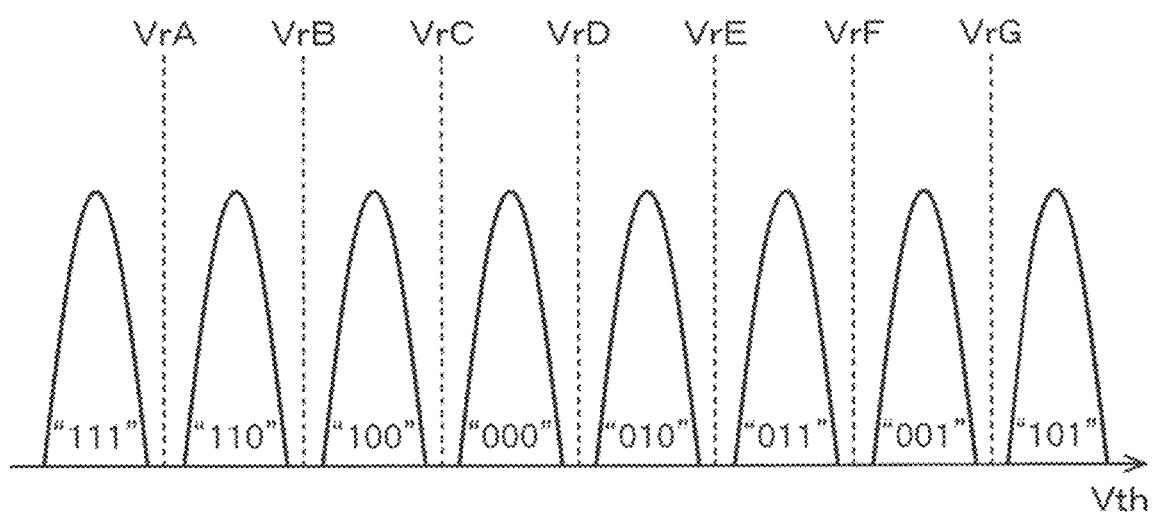
FIG. 9 is a graph illustrating a threshold voltage distribution of the plurality of memory cell transistors for the page storing user data.

FIG. 9 is a graph illustrating a threshold voltage distribution of the plurality of memory cell transistors for the page P storing the user data UD. A target of the present embodiment is a general TLC memory that adopts a coding rule of "2-3-2". As illustrated in FIG. 9, the coding rule of "2-3-2" is an allocation method including two read voltages VrC and VrG for identifying MSB, three read voltages VrB, VrD, and VrF for identifying the CSB, and two read voltages VrA and VrE for identifying the LSB.

Figure 10:
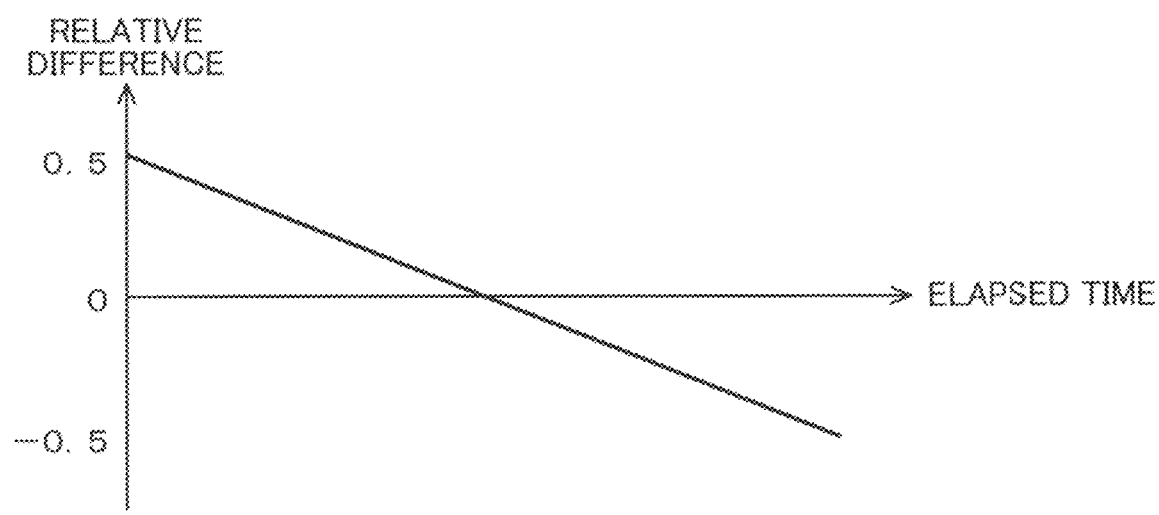
FIG. 10 is a graph illustrating a result of evaluation of an influence caused by data retention occurring for a general TLC memory.

FIG. 10 is a graph illustrating a result of evaluation of an influence caused by data retention occurring for a general TLC memory. A horizontal axis represents elapsed time since the dummy data DD is written in the memory 3, and a vertical axis represents a relative difference of the first error bit number V1 from the second error bit number V2. It can be seen that the relative difference is about "0.5" in an initial state where the elapsed time is "0", and then monotonically decreases with an increase in the elapsed time.

Figure 11:
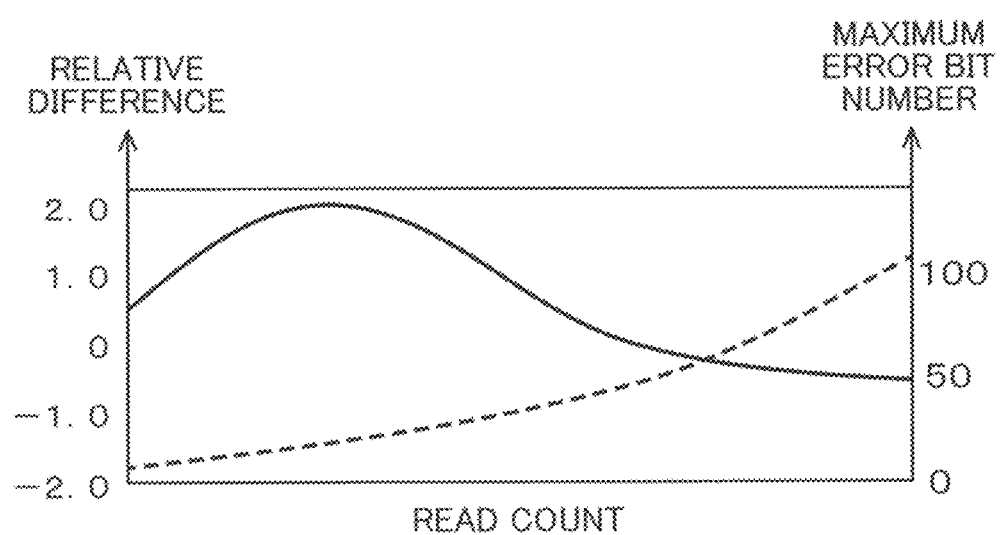
FIG. 11 is a graph illustrating a result of evaluation of an influence caused by read disturb occurring for a general TLC memory.

FIG. 11 is a graph illustrating a result of evaluation of an influence caused by read disturb occurring for a general TLC memory. The horizontal axis represents a read count of the dummy data DD from the memory cell array 22, a left vertical axis (solid line) represents the relative difference of the first error bit number V1 from the second error bit number V2, and a right vertical axis (broken line) represents a maximum error bit number occurring in the dummy data DD. It can be seen that the relative difference is about "0.5" in an initial state where the read count is "0", temporarily increases to about "2.0" at a stage where the read count is relatively small, then turns to a decreasing trend, and finally converges to about "−0.5". In addition, it can be seen that the maximum error bit number gradually increases as the read count increases.

Figure 12:
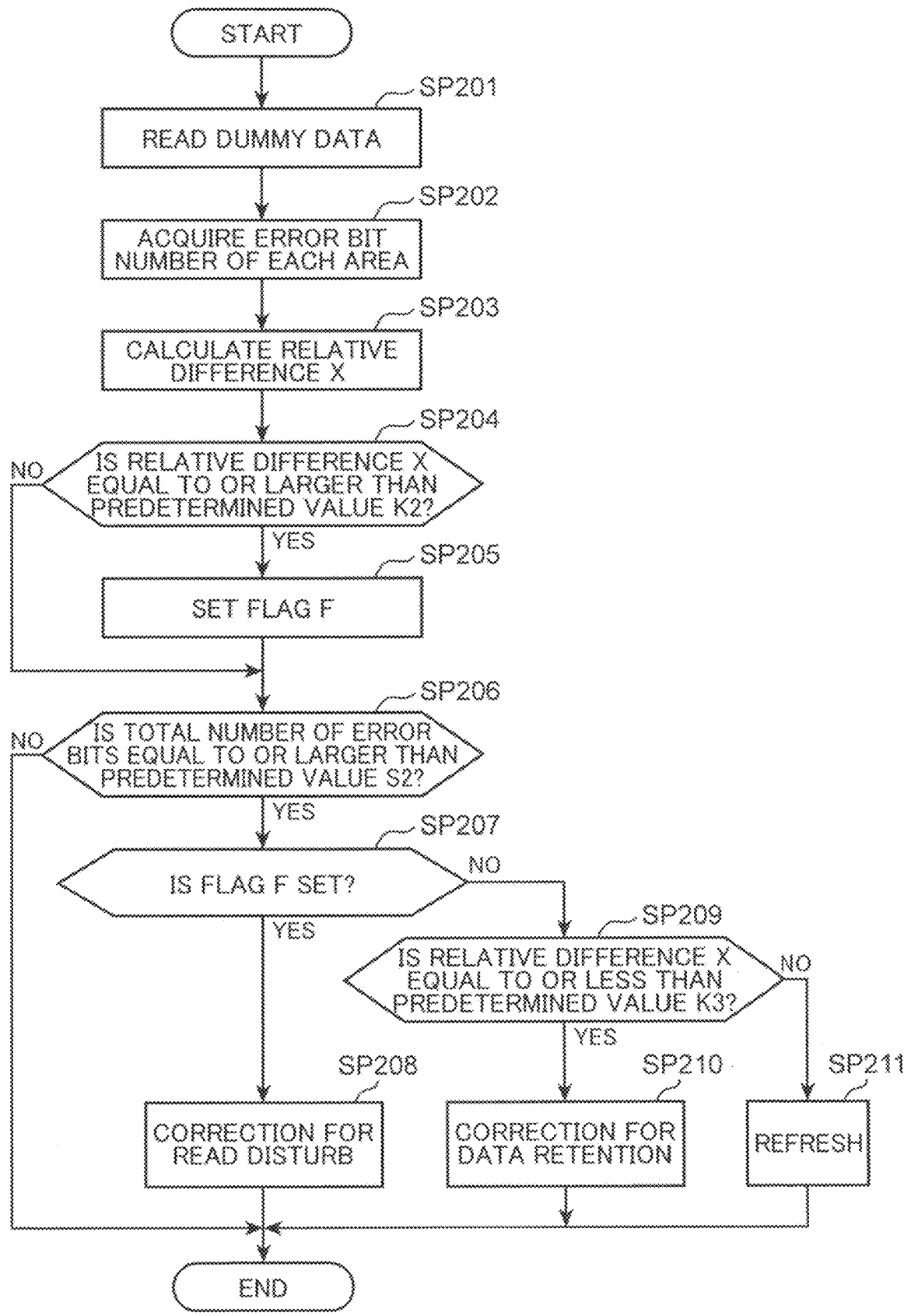
FIG. 12 is a flowchart illustrating contents of correction processing of the read voltage executed by the memory controller.

FIG. 12 is a flowchart illustrating the contents of correction processing of the read voltage executed by the memory controller 2.

First, in step SP201, the memory controller 2 reads the dummy data DD from the memory cell array 22.

Next, in step SP202, the ECC processor 11 detects a first error bit number V1 as the number of error bits occurring in the first data area R1 of the read dummy data DD and a second error bit number V2 as the number of error bits occurring in the second data area R2. The calculator 12 acquires the first error bit number V1 and the second error bit number V2 from the ECC processor 11.

Next, in step SP203, the calculator 12 calculates the relative difference X of the first error bit number V1 from the second error bit number V2.

Next, in step SP204, the comparator 13 compares the relative difference X with a predetermined value K2 (second value) set in advance. As illustrated in FIG. 11, in consideration that the relative difference temporarily increases to about "2.0" due to the influence of the read disturb, the predetermined value K2 is set to, for example, "1.5".

When the relative difference X is equal to or larger than the predetermined value K2 (step SP204: YES), next, in step SP205, the setting unit 15 sets a predetermined flag F for recording that the read disturb occurs. On the other hand, when the relative difference X is less than the predetermined value K2 (step SP204: NO), processing of step SP205 is not executed.

Next, in step SP206, the memory controller 2 determines whether the total number of error bits occurring in the dummy data DD (V1+V2) is equal to or larger than a predetermined value S2 set in advance. The predetermined value S2 may be set to a value lower than the upper limit value of the error correction capability by the ECC processor 11.

When the total number of error bits (V1+V2) is less than the predetermined value S2 (step SP206: NO), the correction processing of the read voltage Vr is unnecessary, and thus the memory controller 2 ends the processing.

When the total number of error bits (V1+V2) is equal to or larger than the predetermined value S2 (step SP206: YES), next in step SP207, the corrector 14 determines whether the flag F is set by the setting unit 15.

When the flag F is set (step SP207: YES), next, in step SP208, the corrector 14 executes the correction processing for read disturb. Specifically, the corrector 14 corrects the read voltages VrA to VrG to be higher than the current value. At this time, the corrector 14 may set the correction amount to be larger as a voltage value is lower among the read voltages VrA to VrG, and set the correction amount to be smaller as the voltage value is higher among the read voltages VrA to VrG. With execution of processing of step SP208, the setting unit 15 resets the flag F set in step SP205. On the other hand, unless the processing of step SP208 is executed and the flag F is reset, the flag F remains valid in the next and subsequent processing.

When the flag F is not set (step SP207: NO), next, in step SP209, the comparator 13 compares the relative difference X with a predetermined value K3 (first value) set in advance. As illustrated in FIG. 10, in consideration that the relative difference monotonously decreases to a negative value due to the influence of the data retention, the predetermined value K3 is set to "0", for example.

When the relative difference X is equal to or less than the predetermined value K3 (step SP209: YES), next, in step SP210, the corrector 14 executes correction processing for data retention. Specifically, the corrector 14 corrects the read voltages VrA to VrG to lower than the current value. At this time, the corrector 14 may set the correction amount to be smaller as the voltage value is lower among the read voltages VrA to VrG, and set the correction amount to be larger as the voltage value is higher among the read voltages VrA to VrG.

When the relative difference X exceeds the predetermined value K3 (step SP209: NO), it is considered that the threshold voltage distribution fluctuates due to a composite factor of or a factor other than the read disturb and the data retention. In this case, since it is difficult to correct the read voltage to an optimum value, the corrector 14 sets a predetermined refresh flag in step SP211. When the refresh flag is set, the memory controller 2 executes refresh processing of the memory 3. In the refresh processing, the memory controller 2 reads and saves storage data of the memory cell array 22, erases the storage data of the memory cell array 22, and then rewrites the saved data to the memory cell array 22.

In the memory device 1 according to the present embodiment, it is possible to simply execute the correction processing of the read voltage for the memory 3 including the TLC memory.

In addition, in the memory device 1 according to the embodiment, when it is difficult to appropriately correct the read voltage, operation of the memory device 1 can be continued by executing the refresh processing of the memory 3.

Storage Location of Dummy Data DD

In the above embodiments, a storage location of the dummy data DD in the memory cell array 22 is as follows.

As a first example, the memory cell array 22 includes a first area that stores the user data UD and a second area having a characteristic that an error bit is more likely to occur than in the first area, and the dummy data DD is stored in the second area. The second area is, for example, a physical end in the memory cell array 22 (a page in contact with a peripheral edge, a boundary, or the like of a chip, a page of an uppermost layer or a lowermost layer of a multilayer structure, or the like).

In the first example, it is possible to execute the correction processing of the read voltage before reaching a situation in which error bits frequently occur in the first area storing the user data UD.

As a second example, the memory cell array 22 includes the plurality of blocks B each of which is a data erase unit, and the dummy data DD is stored in each of the plurality of blocks B.

Since a state of occurrence of the read disturb differs for each block B, in the second example, it is possible to execute optimum correction processing for each block B.

As a third example, the plurality of blocks B includes a user block (first block) that stores the user data UD and a free block (second block) that is not used in normal use of the memory device 1, and the dummy data DD is stored in both of the user block and the free block.

In the third example, since the free block is not used in normal use and data reading does not occur, it is considered that there is substantially no influence of the read disturb. Thus, by storing the dummy data DD in the free block and reading the dummy data DD, it is possible to specify only a fluctuation state of the threshold voltage distribution caused by the data retention. Further, by reading the dummy data DD stored in the user block and offsetting the influence caused by the data retention specified above, it is possible to specify a fluctuation state of the threshold voltage distribution caused by the read disturb. As a result, the read voltage can be optimally corrected when the threshold voltage distribution fluctuates due to the composite factor of the read disturb and the data retention.

Overview of Embodiments

A nonvolatile semiconductor storage device according to one aspect of the present invention includes a storage unit that may comprise suitable logic, circuitry, interfaces, and/or code that may be operable to store data, and a control unit that may comprise suitable logic, circuitry, interfaces, and/or code that may be operable to control the storage unit, in which the storage unit stores known data including a first data area having more "0" than "1" of a binary logic and a second data area having more "1" than "0" of the binary logic, and the control unit includes a detector that reads the known data from the storage unit and detects a first error bit number as a number of error bits occurring in the first data area and a second error bit number as a number of error bits occurring in the second data area, a calculator that calculates a relative difference of the first error bit number from the second error bit number, a comparator that compares the relative difference with a first value, and a corrector that corrects a read voltage for reading the data from the storage unit, based on a result of comparison by the comparator.

In this aspect, the storage unit stores the known data including the first data area having more "0" than "1" of the binary logic and the second data area having more "1" than "0" of the binary logic. Then, the control unit reads the known data from the storage unit, and corrects the read voltage in accordance with a state of occurrence of error bits in the first data area and the second data area at that time. Therefore, since the read voltage can be corrected by simple processing of reading the known data from the storage unit, the latency associated with the correction processing of the read voltage can be reduced.

In the above aspect, the storage unit includes a single level cell (SLC) memory, the corrector corrects the read voltage to be lower than a current value when the relative difference is equal to or larger than the first value, and the corrector corrects the read voltage to be higher than the current value when the relative difference is less than the first value.

In this aspect, the correction processing of the read voltage can be easily executed for the storage unit including the SLC memory.

In the above aspect, the storage unit includes a triple level cell (TLC) memory, the comparator further compares the relative difference with a second value, the nonvolatile semiconductor storage device includes a setting unit that may comprise suitable logic, circuitry, interfaces, and/or code that may be operable to set a flag when the relative difference is equal to or larger than the second value, the corrector corrects the read voltage to be higher than a current value when the flag is set by the setting unit, and the corrector corrects the read voltage to be lower than the current value when the flag is not set by the setting unit and the relative difference is equal to or less than the first value.

In this aspect, the correction processing of the read voltage can be easily executed for the storage unit including the TLC memory.

In the above aspect, the corrector causes the control unit to execute refresh processing of the storage unit when the flag is not set by the setting unit and the relative difference exceeds the first value.

In this aspect, when it is difficult to appropriately correct the read voltage, operation of the nonvolatile semiconductor storage device can be continued by executing the refresh processing.

In the above aspect, the corrector sets a correction amount of the read voltage based on at least one of a total number of error bits occurring in the known data, a value of the relative difference, a number of accesses to the storage unit, and an elapsed time since the known data is stored in the storage unit.

In this aspect, it is possible to appropriately set not only a correction direction of the read voltage but also the correction amount of the read voltage.

In the above aspect, the control unit executes correction processing of the read voltage at at least one timing of upon activation of the nonvolatile semiconductor storage device, after a lapse of a predetermined time from previous execution of the correction processing of the read voltage by the corrector, and when a total number of error bits occurring in the data exceeds a correctable value.

In this aspect, it is possible to execute the correction processing of the read voltage at an appropriate timing before a situation in which error bits frequently occur.

In the above aspect, the storage unit includes a first area that stores user data and a second area having a characteristic that an error bit is more likely to occur than in the first area, and the known data is stored in the second area.

In this aspect, it is possible to execute the correction processing of the read voltage before reaching a situation in which error bits frequently occur in the first area storing the user data.

In the above aspect, the storage unit includes a plurality of blocks each of which is a data erase unit that may comprise suitable logic, circuitry, interfaces, and/or code, and the known data is stored in each of the plurality of blocks.

In this aspect, since a state of occurrence of read disturb differs for each block, it is possible to execute optimum correction processing for each block.

In the above aspect, the storage unit includes a plurality of blocks each of which is a data erase unit, and the plurality of blocks includes a first block that stores user data and a second block that is not used in normal use, and the known data is stored in both of the first block and the second block.

In this aspect, by reading the known data stored in the second block that is not used in normal use, it is possible to specify a fluctuation state of the threshold voltage distribution caused by data retention. Further, by reading the known data stored in the first block and offsetting the influence caused by the data retention, it is possible to specify a fluctuation state of the threshold voltage distribution caused by the read disturb.

In the above aspect, when the corrector has been executed correction processing of the read voltage, the control unit uses the corrected read voltage as a read voltage for reading the known data from the storage unit next time.

In this aspect, the read voltage can be updated to an appropriate value every time the correction processing is executed by the corrector.

A read voltage correction method according to one aspect of the present invention is a read voltage correction method of correcting a read voltage for reading data from a storage unit, which may comprise suitable logic, circuitry, interfaces, and/or code, in a nonvolatile semiconductor storage device including the storage unit that stores the data and a control unit that may comprise suitable logic, circuitry, interfaces, and/or code that may be operable to control the storage unit, the storage unit configured to store known data including a first data area having more "0" than "1" of a binary logic and a second data area having more "1" than "0" of the binary logic, the read voltage correction method including (A) reading the known data from the storage unit and detecting a first error bit number as a number of error bits occurring in the first data area and a second error bit number as a number of error bits occurring in the second data area, (B) calculating a relative difference of the first error bit number from the second error bit number, (C) comparing the relative difference with a first value, and (D) based on a result of comparison by (C), correcting a read voltage for reading the data from the storage unit.

In this aspect, the storage unit stores the known data including the first data area having more "0" than "1" of the binary logic and the second data area having more "1" than "0" of the binary logic. Then, the known data is read from the storage unit, and the read voltage is corrected in accordance with a state of occurrence of error bits in the first data area and the second data area at that time. Therefore, since the read voltage can be corrected by simple processing of reading the known data from the storage unit, the latency associated with the correction processing of the read voltage can be reduced.

The functionality of the elements disclosed herein may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

While the invention has been described in detail, the foregoing description is in all aspects illustrative and not restrictive. It is understood that numerous other modifications and variations can be devised without departing from the scope of the invention.

What is claimed is:

1. A nonvolatile semiconductor storage device having circuitry comprising:
a storage configured to store data; and
a control circuit configured to control the storage,
wherein the storage is configured to store known data including a first data area having more "0" than "1" of a binary logic and a second data area having more "1" than "0" of the binary logic, and
the circuitry is configured to
read the known data from the storage and detect a first error bit number as a number of error bits occurring in the first data area and a second error bit number as a number of error bits occurring in the second data area, the known data being read from the first data area and the second data area using a read voltage that is the same for the first data area and the second data area,
calculate a relative difference of the first error bit number from the second error bit number,
compare the relative difference with a first value, and
correct the read voltage for reading the data from the storage, based on a result of comparison.

2. The nonvolatile semiconductor storage device according to claim 1, wherein the storage includes a single level cell (SLC) memory, and
the circuitry is configured to
correct the read voltage to be lower than a current value when the relative difference is equal to or larger than the first value, and
correct the read voltage to be higher than the current value when the relative difference is less than the first value.

3. The nonvolatile semiconductor storage device according to claim 1, wherein the storage includes a triple level cell (TLC) memory, and
the circuitry is configured to
further compare the relative difference with a second value,
set a flag when the relative difference is equal to or larger than the second value,
correct the read voltage to be higher than a current value when the flag is set, and
correct the read voltage to be lower than the current value when the flag is not set and the relative difference is equal to or less than the first value.

4. The nonvolatile semiconductor storage device according to claim 3, wherein the circuitry is configured to execute refresh processing of the storage when the flag is not set and the relative difference exceeds the first value.

5. The nonvolatile semiconductor storage device according to claim 1, wherein the circuitry is configured to
set a correction amount of the read voltage based on at least one of
a total number of error bits occurring in the known data,
a value of the relative difference,
a number of accesses to the storage, and
an elapsed time since the known data is stored in the storage.

6. The nonvolatile semiconductor storage device according to claim 1, wherein the circuitry is configured to
execute correction processing of the read voltage at at least one timing of
upon activation of the nonvolatile semiconductor storage device,
after a lapse of a predetermined time from previous execution of the correction processing of the read voltage by the corrector, and
when a total number of error bits occurring in the data exceeds a correctable value.

7. The nonvolatile semiconductor storage device according to claim 1, wherein
the storage includes a first area that stores user data and a second area having a characteristic that an error bit is more likely to occur than in the first area, and
the known data is stored in the second area.

8. The nonvolatile semiconductor storage device according to claim 1, wherein
the storage includes a plurality of blocks each of which is a data erase unit, and
the known data is stored in each of the plurality of blocks.

9. The nonvolatile semiconductor storage device according to claim 1, wherein
the storage includes a plurality of blocks each of which is a data erase unit, and
the plurality of blocks includes a first block that stores user data and a second block that is not used in normal use, and
the known data is stored in both of the first block and the second block.

10. The nonvolatile semiconductor storage device according to claim 1, wherein the circuitry is configured to use, if correction processing of the read voltage has been executed, the corrected read voltage as a read voltage for reading the known data from the storage next time.

11. A read voltage correction method of correcting a read voltage for reading data from a storage in a nonvolatile semiconductor storage device having circuitry including the storage configured to store the data and a control circuit configured to control the storage, the storage configured to store known data including a first data area having more "0" than "1" of a binary logic and a second data area having more "1" than "0" of the binary logic,
the read voltage correction method comprising:
reading the known data from the storage and detecting a first error bit number as a number of error bits occurring in the first data area and a second error bit number as a number of error bits occurring in the second data area, the known data being read from the first data area and the second data area using a read voltage that is the same for the first data area and the second data area;
calculating a relative difference of the first error bit number from the second error bit number;
comparing the relative difference with a first value; and
based on a result of comparison, correcting a read voltage for reading the data from the storage.

12. The nonvolatile semiconductor storage device according to claim 1, wherein the nonvolatile semiconductor storage device is a NAND flash memory.

13. The nonvolatile semiconductor storage device according to claim 8, wherein
each of the plurality of blocks includes a plurality of pages, and
data stored in each of the plurality of pages is organized to have an equal number of bits of "0" and bits of "1".

14. The nonvolatile semiconductor storage device according to claim 13, wherein the data stored in each of the plurality of pages is organized according to a randomizing process.

15. The non-volatile semiconductor storage device according to claim 14, wherein when dummy data is written to a page of the plurality of pages, the randomizing process is not performed on the dummy data.

16. The nonvolatile semiconductor storage device according to claim 15, wherein the known data is the dummy data.

* * * * *